(12) United States Patent
Freeman

(10) Patent No.: US 9,153,334 B2
(45) Date of Patent: Oct. 6, 2015

(54) MEMORY DEVICES INCLUDING CAPACITOR STRUCTURES HAVING IMPROVED AREA EFFICIENCY

(71) Applicant: Micron Technology, Inc., Boise, ID (US)

(72) Inventor: Eric H. Freeman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/216,168

(22) Filed: Mar. 17, 2014

(65) Prior Publication Data

US 2014/0198582 A1 Jul. 17, 2014

Related U.S. Application Data

(62) Division of application No. 12/364,843, filed on Feb. 3, 2009, now Pat. No. 8,680,650.

(51) Int. Cl.

| H01L 29/92 | (2006.01) |
|---|---|
| H01L 21/02 | (2006.01) |
| G11C 16/24 | (2006.01) |
| G11C 16/10 | (2006.01) |
| H01L 49/02 | (2006.01) |
| H01L 27/108 | (2006.01) |

(52) U.S. Cl.
CPC .............. *G11C 16/24* (2013.01); *G11C 16/102* (2013.01); *H01L 27/1085* (2013.01); *H01L 28/82* (2013.01); *H01L 27/10808* (2013.01); *H01L 27/10894* (2013.01); *H01L 27/10897* (2013.01)

(58) Field of Classification Search
CPC ............ H01L 27/108; H01L 27/11521; H01L 27/10897; H01L 25/0657
USPC ........... 257/303–310, 532, E21.008, E29.343
See application file for complete search history.

(56) References Cited

U.S. PATENT DOCUMENTS

| 6,066,537 | A | 5/2000 | Poh |
| 6,211,008 | B1 * | 4/2001 | Yu et al. ................ 438/253 |
| 6,383,858 | B1 | 5/2002 | Gupta et al. |
| 6,566,702 | B1 | 5/2003 | Clampitt |
| 7,022,581 | B2 | 4/2006 | Harris et al. |
| 7,105,403 | B2 | 9/2006 | Graettinger et al. |
| 7,468,323 | B2 | 12/2008 | Torek et al. |
| 2003/0073282 | A1 * | 4/2003 | Ning ....................... 438/243 |
| 2006/0216923 | A1 | 9/2006 | Tran et al. |
| 2007/0238299 | A1 | 10/2007 | Niroomand et al. |
| 2008/0230873 | A1 * | 9/2008 | Demircan et al. ........... 257/620 |
| 2009/0168482 | A1 * | 7/2009 | Park et al. .................. 365/51 |
| 2009/0243036 | A1 * | 10/2009 | Kim .......................... 257/532 |
| 2010/0195392 | A1 | 8/2010 | Freeman |

* cited by examiner

*Primary Examiner* — Cuong Q Nguyen
(74) *Attorney, Agent, or Firm* — TraskBritt

(57) ABSTRACT

Semiconductor structures including a plurality of conductive structures having a dielectric material therebetween are disclosed. The thickness of the dielectric material spacing apart the conductive structures may be adjusted to provide optimization of capacitance and voltage threshold. The semiconductor structures may be used as capacitors, for example, in memory devices. Various methods may be used to form such semiconductor structures and capacitors including such semiconductor structures. Memory devices including such capacitors are also disclosed.

18 Claims, 5 Drawing Sheets

MEMORY DEVICES INCLUDING CAPACITOR STRUCTURES HAVING IMPROVED AREA EFFICIENCY

CROSS-REFERENCE TO RELATED APPLICATION

This application is a divisional of U.S. patent application Ser. No. 12/364,843, now U.S. Pat. No. 8,680,650, issued Mar. 25, 2014, the disclosure of which is hereby incorporated herein in its entirety by this reference.

TECHNICAL FIELD

The invention, in various embodiments, relates generally to capacitor structures that may be used, for example, in memory devices, and to methods of forming such capacitors.

BACKGROUND

In semiconductor memories, such as NAND-type flash memories, capacitors are used in various types of peripheral circuits such as charge pump circuits, sense amplifiers and the like. These capacitors are formed as MOS capacitors or well capacitors above a semiconductor substrate by the same process as that of transistors used in other circuits.

A conventional NAND device comprises a memory array having rows and columns of memory cells. Each of the memory cells is fabricated as a field-effect transistor having a control gate and a floating gate. The floating gate is capable of holding a charge and is separated from source and drain regions within a substrate by a dielectric material. Each of the memory cells can be electrically programmed (or charged) by injecting electrons from the drain region through an oxide layer onto the floating gate. The charge can be removed from the floating gate by tunneling the electrons to the source through the dielectric material during an erase operation. Thus, the data in a memory cell is determined by the presence or absence of a charge on the floating gate.

As the performance and complexity of electronic systems increase, the requirement for additional memory in a system also increases. In order to continue to reduce the costs of the system, the memory density of an integrated circuit may be increased. However, decreased reliability becomes increasingly problematic as the thickness of the dielectric material is further scaled down to facilitate increased device density. Decreasing the thickness of the dielectric material used in "high-stress" circuits may result in dielectric breakdown.

Conventional NAND memory devices have an operating voltage (Vcc) in the range of from about 20 volts to about 29 volts. A high voltage, otherwise referred to as a "programming voltage," of about 8 volts or greater is conventionally required for programming and erase operations in NAND memory devices. For example, if the thickness of the dielectric material for a NAND device is 55 nm, a capacitor having an area of 10 mm$^2$ may sustain a voltage of about 2.2 volts without reliability concerns. The smaller the over-all device area, the higher sustainable stress voltage is allowed for the device.

For example, a charge pump, which may be used to generate the programming voltage pulses, conventionally includes a plurality of series-connected pump stages that are driven by two non-overlapping clock signals. The series-connected pump stages multiply the amplitude of the clock signals. The actual voltage obtained at the charge pump output terminal depends on the number of pump stages and on the charge transfer efficiency of the pump stages. In addition to providing a programming voltage pulse to the memory cells, the charge pump may also be used to support decoding. Therefore, the charge pump is subjected to varying load conditions that may affect the ramp-up rate of the programming voltage pulse. Under heavy loading, the ramp-up rate may be relatively slow. If the load is suddenly reduced, the ramp-up rate may increase dramatically, overstressing the dielectric material of the floating-gate transistor.

On the other hand, the thinner the dielectric material, the lower the stress it can sustain for a given surface area. In a NAND device, many different kinds of charge pump circuits are required to provide different internally generated voltage levels. These pump circuits usually are equipped with several different sized charge pump circuit capacitors made by planar capacitors having a fixed size. When the number of the pump circuits is increased, and the size of the charge pump circuit capacitors used in the charge pump circuits decreases, the reliability of the capacitor dielectric becomes a concern, especially for those capacitors operated at high voltage levels.

DETAILED DESCRIPTION

Figure 1:
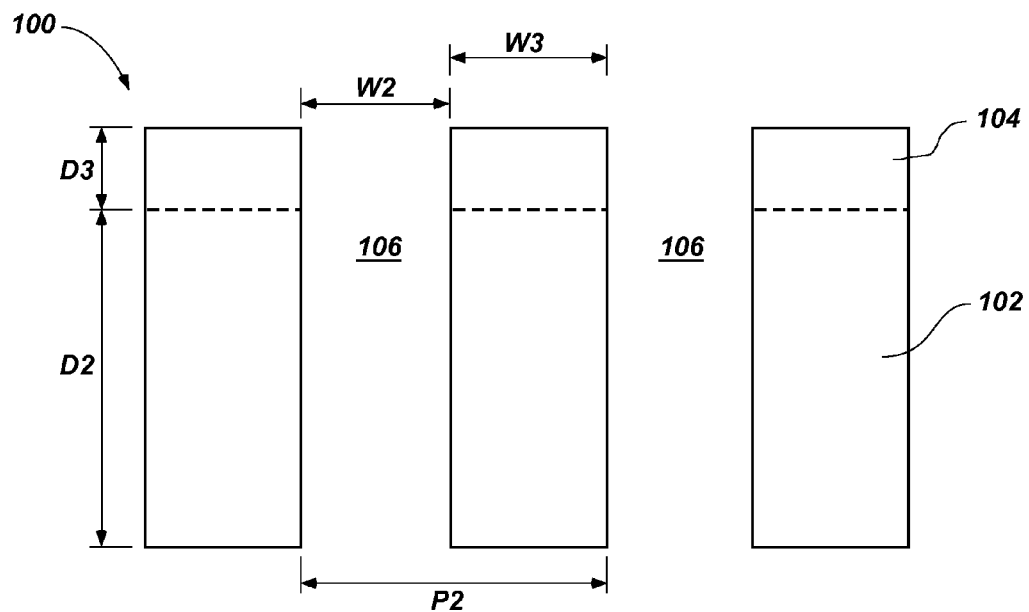
FIG. 1 is an enlarged view of a portion of an embodiment of a capacitor.

As discussed in further detail below, in some embodiments, the present invention includes capacitors for semiconductor structures, such as NAND devices. The capacitors may have increased capacitance efficiency per unit area in comparison to conventional capacitors and may include a plurality of conductive structures at a variable distance from one another by a dielectric material. Since spacing between the conductive structures of the capacitors may be adjusted, the capacitors may be tailored to withstand increased voltages utilized, for example, in the peripheral circuits and charge pump circuits of a NAND memory device. For example, each of the conductive structures may have a width of less than 65 nm and may be laterally aligned with and spaced apart from an adjacent conductive structure by a dielectric material. The thickness of the dielectric material may be selected based on a dielectric constant thereof and a desired applied voltage the capacitor must withstand. Such a capacitor may be used in, for example, a charge pump circuit or other peripheral circuits of a NAND memory device, which will be discussed in further detail below. In other embodiments, the present invention includes methods of forming such capacitors and a memory device including such capacitors.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular memory device, semiconductor structure, or system, but are merely idealized representations that are employed to describe the present invention. The drawings presented herein are not necessarily drawn to scale. Additionally, elements common between drawings may retain the same numerical designation.

The following description provides specific details, such as material types, material thicknesses, and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the semiconductor structure is present, and the semiconductor devices described below do not form a complete electronic device. Only those process acts and semiconductor structures or semiconductor devices necessary to understand the embodiments of the invention are described in detail below. Additional processing acts to form a complete semiconductor device from the semiconductor structures or to form a complete electronic device from the semiconductor device may be performed by conventional fabrication techniques, which are not described herein.

The materials described herein may be formed by any technique suitable for the material in question including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials may be formed as layers, the materials are not limited thereto and may be formed in other three-dimensional configurations.

FIG. 1 is a partial cross-sectional view illustrating an embodiment of a capacitor of the present invention. As shown in FIG. 1, a capacitor 100 may include a plurality of conductive structures 102, each of which may be formed from a conductive material such as, for example, polysilicon, tungsten silicide, or a metal, or may include a plurality of conductive materials (not shown), each of which is formed by a method known in the art of integrated circuit fabrication. The conductive structures 102 may have any suitable transverse cross-sectional shape such as, for example, a circular cross-sectional shape, a rectangular cross-sectional shape, an elliptical cross-sectional shape, or a triangular cross-sectional shape. Each of the conductive structures 102 may have a height D2 of less than about 300 nm, such as from about 50 nm to about 180 nm. The height D2 and width W3 of the conductive structures 102 may be controlled so that each of the conductive structures 102 has a desired aspect ratio. The term "aspect ratio" refers to the ratio of the height (D2) to the width (W3) of the conductive structures 102, and is expressed herein as a ratio of height to width (D2:W3). As a non-limiting example, the conductive structures 102 may each have an aspect ratio in a range of from about 2:1 to about 8:1 and, more specifically, an aspect ratio of about 6.6:1.

The conductive structures 102 of the capacitor 100 may be configured to provide a desired area of capacitance within pitch P2 by adjusting the aspect ratio of the conductive structures 102 and the width W2. The term "pitch," as used herein, means and includes the distance between one edge of a feature (conductive structure 102) and the corresponding edge of an adjacent feature (adjacent conductive structure 102). The aspect ratio of the conductive structures 102 within the capacitor 100 having the pitch P2 may be adjusted to achieve increased capacitance. As a non-limiting example, the conductive structures 102 may be configured as laterally-spaced lines in a pattern (not shown) that may resemble, for example, a comb-like structure, as will be discussed in further detail below. The conductive structures 102 may be positioned in a substantially vertical orientation and substantially parallel to one another, as will be described in further detail.

Each of the conductive structures 102 of the capacitor 100 may, optionally, include an oxide-nitride-oxide material 104, as shown by broken lines. The oxide-nitride-oxide material 104, if present, may have a height D3 in a range of from about 20 nm to about 30 nm.

The plurality of aligned, laterally-spaced conductive structures 102 may be spaced-apart by a dielectric material 106, a thickness (designated as thickness W2) of which may be adjusted to withstand a desired voltage or to substantially increase capacitance. The dielectric material 106 may include, but is not limited to, an oxide or a nitride. As a non-limiting example, the dielectric material 106 may include silicon dioxide ($SiO_2$), tantalum pentoxide ($Ta_2O_5$), silicon nitride ($Si_3N_4$), hafnium oxide ($HfO_2$), aluminum oxide ($Al_2O_3$) or an air gap. The thickness W2 of the dielectric material 106 may be determined according to a dielectric constant thereof and an applied voltage of the fully formed memory device. The term "applied voltage" refers to a voltage having a magnitude sufficient to charge or discharge the gate of a memory cell. The applied voltage induces a voltage differential between the gate and the source/drain regions adjacent a memory device, such as a NAND memory device. As a non-limiting example, the applied voltage may be a maximum voltage that may be applied to a capacitor 100.

In this way, the conductive structures 102 may be used to form a capacitor 100 having improved capacitance efficiency per unit area compared to conventional planar capacitor structures, and may be tailored to withstand higher voltages. By way of non-limiting example, if a capacitor 100 having a pitch P2 of 120 nm between adjacent conductive structures 102 is desired, a plurality of conductive structures 102, each having a width W3 of 35 nm and a height D2 of 165 nm, may be spaced apart by a dielectric material 106 including silicon dioxide and having a thickness W2 of 25 nm, which provides 330 nm of capacitor area width within the desired pitch P2 of 120 nm. In comparison to a conventional planar capacitor, the capacitor 100 includes a substantially increased area of capacitance within the same pitch P2, more specifically, 2.75 times the capacitance within the pitch P2 of 120 nm. Therefore, the capacitor 100 may provide the same or a substantially increased capacitance in a smaller space than a conventional planar capacitor. More particularly, each conductive structure 102 may have a width W3 in a range of from about 30 nm to about 40 nm and may be spaced apart from the adjacent conductive structure 102 by a dielectric material having a thickness W2 in a range of from about 20 nm to about 30 nm. Even more particularly, each conductive structure 102 may have an average width W3 of about 35 nm and may be spaced from the adjacent conductive structure 102 by a dielectric material having a thickness W2 of about 25 nm.

By way of non-limiting example, the dielectric material 106 may be silicon dioxide having a width W3 of about 35 nm and the width W3 of the conductive structure 102 may be between about 25 nm and about 50 nm for higher voltage circuits, to form a capacitor 100 having a pitch P2 of about 60 nm. For example, if the conductive structure 102 has a height D2 of about 100 nm, a plate width of about 100 nm per line may be achieved. Fringe capacitance may substantially increase a capacitance of the capacitor 100. Therefore, the capacitor 100 may have a capacitance of greater than about 1.6 times that of a conventional planar capacitor occupying the same pitch P2.

The capacitor 100 may be scaled to operate at a lower voltage (i.e., about 20 volts) by adjusting the pitch P2. As a non-limiting example, the width W3 of the conductive structure 102 and the width W2 of the dielectric material 106 may be about 25 nm, so that the pitch P2 of the capacitor 100 is about 49.8 nm and the capacitance may be about 1.2 times that of a conventional planar capacitor to provide an increased capacitance.

To reduce the capacitance field in the dielectric and improve reliability of the capacitor 100, while still maintaining good area efficiency, the space between the conductive structures 102 may be increased. In this way, the capacitor 100 may be scaled for use in decoupling caps or ESD circuits that may be exposed to unusually high voltages higher than conventional programming voltage.

By way of non-limiting example, the capacitor 100 may be utilized in the peripheral circuitry of a NAND device, such as in a decoupling capacitor, or a charge pump circuit, and the thickness of the dielectric material 106 between each of the conductive structures 102 may be tailored to withstand voltages higher than those conventionally employed. Thus, the capacitor 100 enables peripheral circuitry to operate at substantially increased voltages, while the risk of breakdown of the dielectric material 106 is substantially decreased or eliminated. By way of non-limiting example, the voltage generated by the charge pump circuit or peripheral circuit may be between about 5 volts and about 30 volts.

Figure 2:
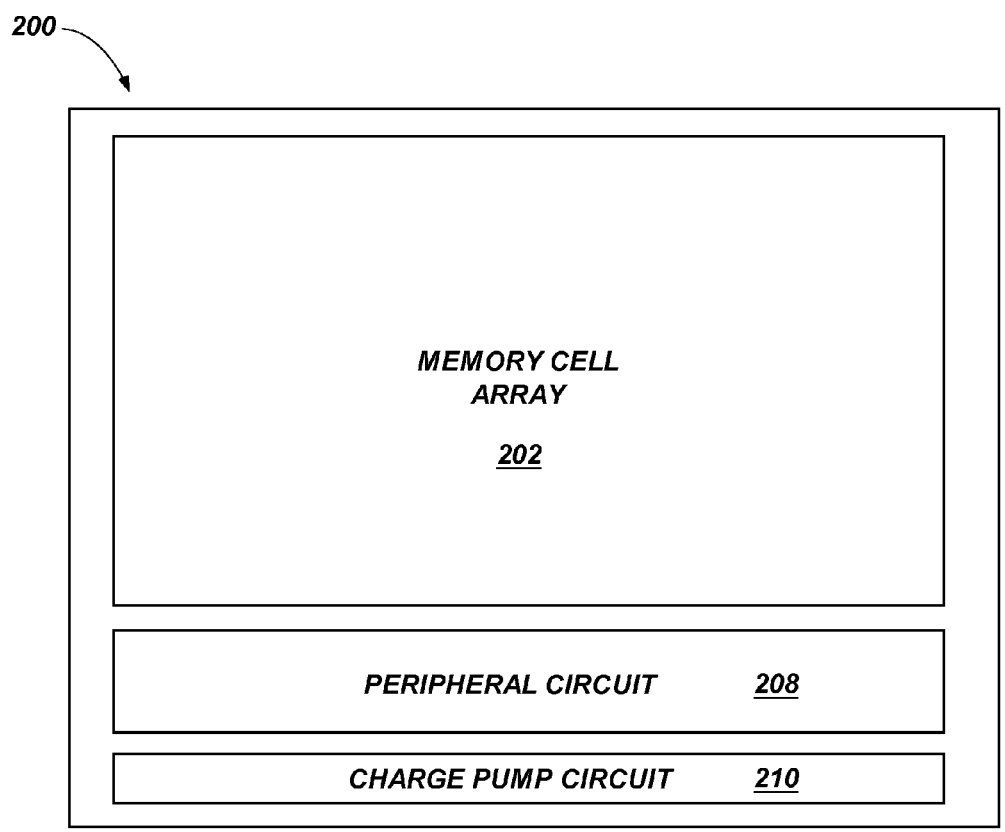
FIG. 2 is a block diagram illustrating an embodiment of a memory device including a memory cell array, a peripheral circuit and a charge pump circuit that includes a capacitor such as that shown in FIG. 1.

Capacitors such as that shown in FIG. 1 may be used in embodiments of integrated circuits of the present invention. FIG. 2 is a block diagram of an illustrative memory device 200 according to an embodiment of the present invention. The memory device 200 may include at least one memory cell array 202 such as, for example, a plurality of NAND memory arrays. The memory device 200 may further include at least one peripheral circuit 208 that inputs data from outside the memory device 200, thus providing access to the at least one memory cell array 202. The memory device 200 may further include a charge pump circuit 210 for generating an input voltage. The peripheral circuit 208 and the charge pump circuit 210 may include at least one capacitor, such as the embodiment of the capacitor 100 shown in FIG. 1. The peripheral circuit 208 and charge pump circuit 210 may communicate electrically with the at least one memory cell array 202 by way of capacitors 100. By providing variable space between conductive structures within the capacitor 100, the capacitors 100 enable the peripheral circuit 208 and the charge pump circuit 210 to withstand higher voltages and provide increased capacitance in a smaller area. The memory device 200 may, optionally, include at least one decoder.

Figure 3A:
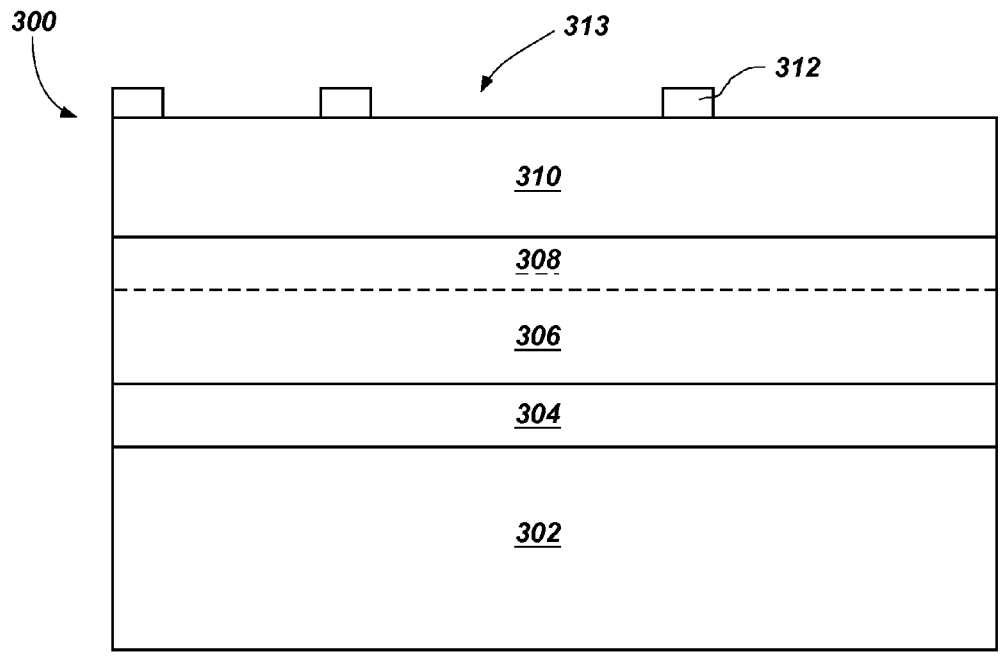
FIGS. 3A-3F are partial cross-sectional side views of semiconductor structures and illustrate an embodiment of a method that may be used to form a capacitor such as that shown in FIG. 1.

An embodiment of a method that may be used to form the capacitor 100 shown in FIG. 1 is described with reference to FIGS. 3A-3G. Referring to FIG. 3A, a semiconductor structure 300 may be provided, which, includes a substrate 302, an intermediate material 304, a conductive material 306, a sacrificial material 310, and a mask material 312. The conductive material 306 may be utilized to form conductive structures 322 (see FIG. 3F) of capacitor 332. The intermediate material 304 may be formed over and in contact with the substrate 302, the conductive material 306 may be formed over and in contact with the intermediate material 304, the sacrificial material 310 may be formed over and in contact with the conductive material 306, and the mask material 112 may be formed over and in contact with the sacrificial material 310. As used herein, the term "substrate" means and includes a base material or construction upon which materials, such as the intermediate material 304 and conductive material 306, are disposed. The substrate 302 may be a semiconductor substrate, a base semiconductor layer on a supporting structure, a metal electrode or a semiconductor substrate having one or more layers, structures or regions formed thereon. The substrate 302 may include, for example, silicon-on-insulator (SOI) type substrates, silicon-on-sapphire (SOS) type substrates, or epitaxial layers of silicon supported by a layer of base material. Semiconductor type materials may be doped or undoped.

The intermediate material 304 may include a dielectric material such as, for example, silicon dioxide ($SiO_2$), tantalum pentoxide ($Ta_2O_5$) or silicon nitride ($Si_3N_4$). The intermediate material 304 may be formed on the substrate 302 by a conventional deposition process, such as by chemical vapor deposition. If the intermediate material 304 is formed from $SiO_2$, the intermediate material 304 may, alternatively, be formed by decomposing tetraethyl orthosilicate (TEOS). The thickness of the conductive material 306 may correspond to the desired height D2 of the conductive structures 322. The conductive material 306 may be formed at a thickness of less than or equal to about 300 nm. The conductive material 306 may be formed from, for example, a polysilicon; a silicide, such as tungsten silicide; an oxide-nitride-oxide material; or a metal, such as tungsten, hafnium, zirconium, titanium, tantalum, aluminum, ruthenium, palladium, platinum, cobalt, nickel, combinations thereof, or an alloy thereof. The conductive material 306 may be formed over the intermediate material 304 using conventional deposition techniques, which are not described in detail herein. The conductive material 306 may be a single layer or may include a plurality of portions or layers (not shown) formed over one another. In addition, the conductive material 306 may, optionally, include an oxide-nitride-oxide ("ONO") material 308 (shown by broken lines). By way of non-limiting example, the ONO material 308 may be silicon oxide-silicon nitride-silicon oxide. The thickness of the ONO material 308 may correspond to the desired height D3. The ONO material 308 may have a thickness in a range of from about 20 nm to about 30 nm and, more particularly, about 25 nm. Additional features, such as, for example, conductive lines (which may simply include conductive pads in additional embodiments) and electrical contacts, may also be formed on or in the surface of the substrate 302. These additional features may be formed prior and/or subsequent to forming the conductive material 306. Such additional features are not illustrated in FIGS. 3A-3G to simplify the figures.

The sacrificial material 310 may include a dielectric material such as, for example, silicon dioxide or a polymer material. The sacrificial material 310 may be formed on the conductive material 306 and the ONO material 308, if present, by conventional techniques, which are not described in detail herein. The mask material 312 may include, for example, a photoresist material or a metal material. The mask material 312 may be formed on the sacrificial material 310. A plurality of apertures 313 exposing a surface of the sacrificial material 310 may then be formed by patterning the mask material 312. The formation and patterning of the mask material 312 may be conducted by conventional techniques, which are not described in detail herein.

Figure 3B:
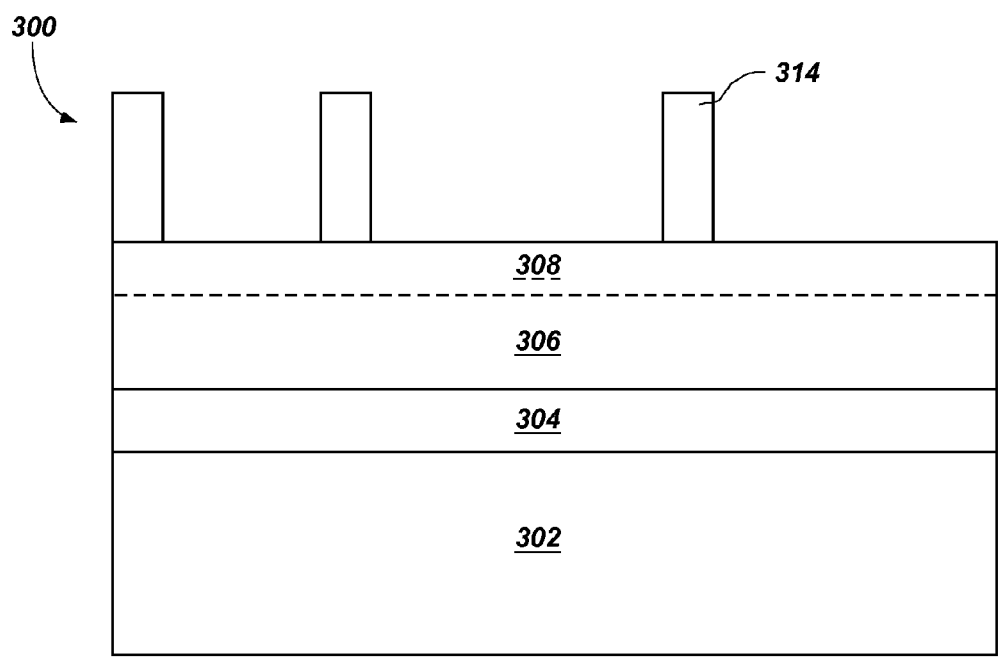

Referring to FIG. 3B, the sacrificial material 310 may be removed through the apertures 313 in the mask material 312 using, for example, an anisotropic reactive ion (i.e., plasma) etching process, to form a plurality of discrete regions 314 of the sacrificial material 310. The particular composition of the etchant used to remove the sacrificial material 310 selective to the mask material 312 and the conductive material 306 may be selected based on the materials used as the sacrificial material 310, the mask material 312 and the conductive material 306. As a non-limiting example, if the sacrificial material 310 is formed from silicon dioxide, the mask material 312 is formed from a photoresist material and the conductive material 306 is formed from an oxide-nitride-oxide material, a buffered hydrofluoric acid solution may be used to selectively remove the sacrificial material 310 to form the discrete regions 314 of the sacrificial material 310. The width of the discrete regions 314 may correspond to a desired thickness W2 of a dielectric material that will later be disposed between conductive structures 322.

Figure 3C:
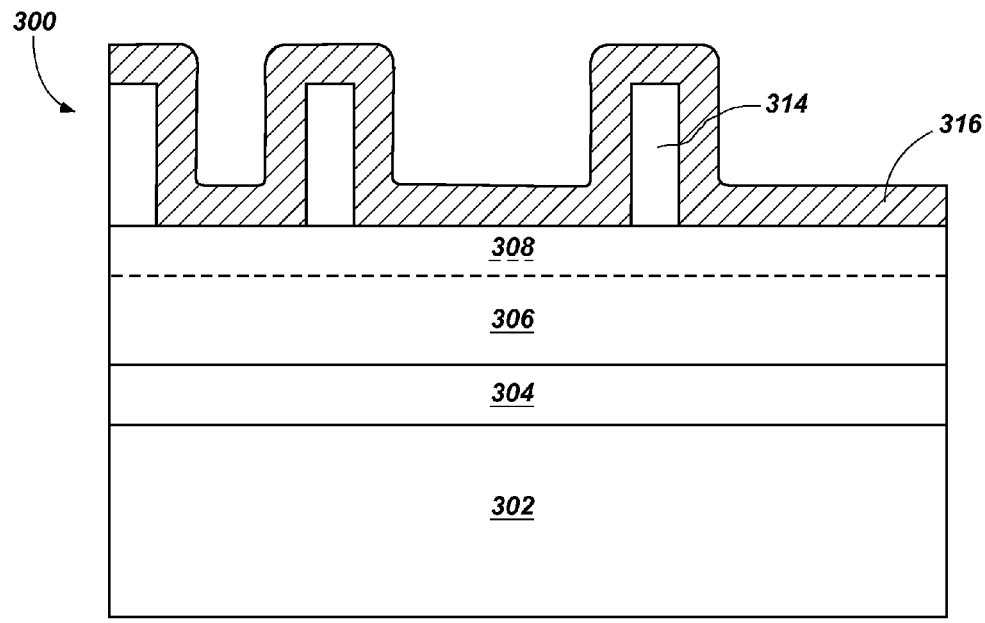

As shown in FIG. 3C, a spacer material 316 may be applied over the exposed surfaces of the conductive material 306 and over exposed surfaces of the discrete regions 314. As a non-limiting example, the spacer material 316 may be deposited conformally and may include a dielectric material, such as silicon dioxide or silicon nitride. The spacer material 316 may be formed by conventional techniques such as, for example, ALD, PVD, and CVD. The spacer material 316 may be deposited at a thickness that corresponds to the desired width W3 of the conductive structures 322.

Figure 3D:
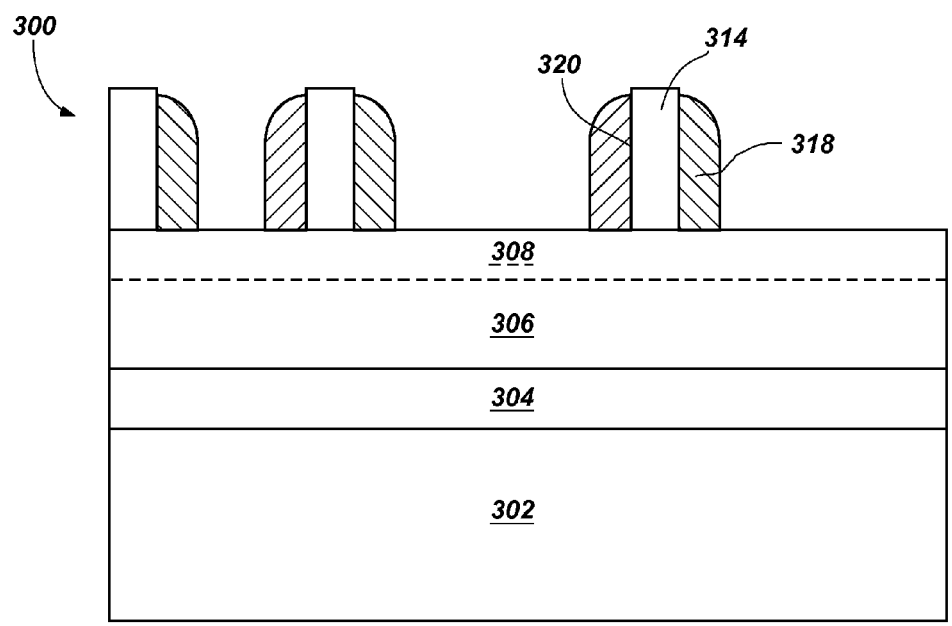
Figure 3E:
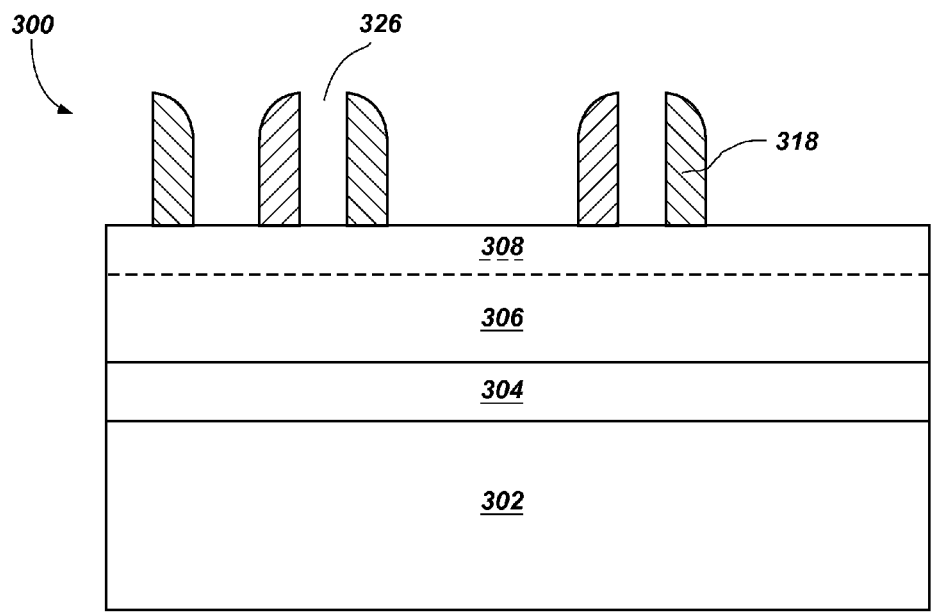

As shown in FIG. 3D, a portion of the spacer material 316 may be removed to form spacers 318 on sidewalls 320 of the discrete regions 314. In some embodiments, an etching process preferential for the exposed horizontal surfaces of the spacer material 316, such as a directional etching process, may be performed to remove the spacer material 316 overlying the top surfaces of the discrete regions 314 and the surfaces of the conductive material 306. The spacers 318 flank the sidewalls 320 of the discrete regions 314. As shown in FIG. 3E, the discrete regions 314 may then be removed using, for example, an etching process selective with respect to the spacers 318 and the conductive material 306. Removing the discrete regions 314 fauns gaps 326 between the spacers 318. By way of non-limiting example, if the discrete regions 314 are foamed from silicon dioxide and the spacers 318 are formed from silicon nitride, a dry (i.e., plasma) etching process using tetrafluoromethane ($CH_4$) or trifluoromethane ($CHF_3$) may be used to remove the discrete regions 314 without substantially removing the spacers 318 and the conductive material 306, to form the structure shown in FIG. 3E.

Figure 3F:
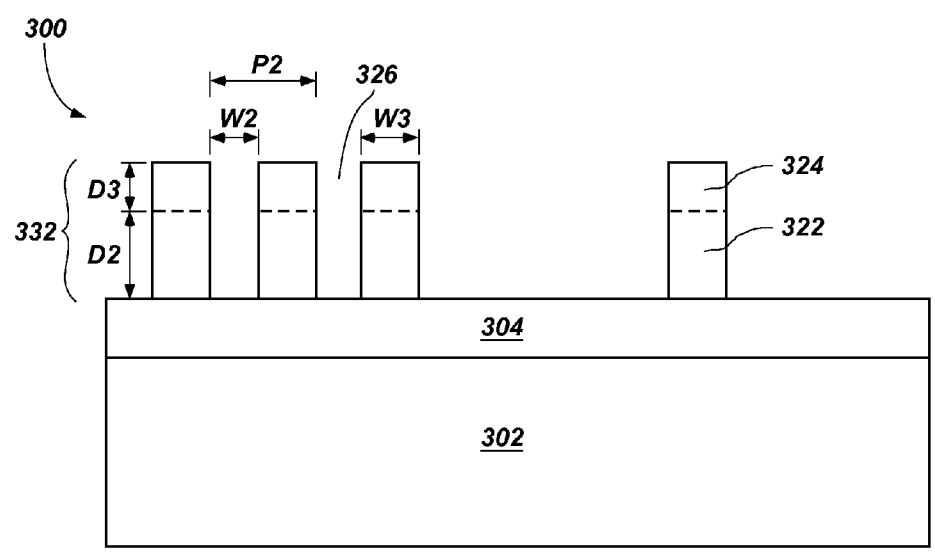

Referring still to FIG. 3E, the spacers 318 may be used as a mask to remove exposed regions of the conductive material 306 and the ONO material 308, if present. The regions of the conductive material 306 protected by the spacers 318 correspond to the conductive structures 322 of the capacitor 332. Exposed portions of the conductive material 306 may be removed selective to the spacers 318 using, for example, an etchant that removes the conductive material 306 at a faster rate than the spacers 318. Again, the particular composition of the etchant may be selected based on the materials used for the conductive material 306 and the spacers 318. By way of example and not limitation, if the spacers 318 are formed from silicon nitride and the conductive material 306 is formed from tungsten silicide, a reactive ion etching (RIE) process using a mixture of chlorine and an oxidizing agent may be used to selectively remove the exposed portions of the tungsten silicide without substantially removing the silicon nitride. After removing the spacers 318 using conventional techniques, the remaining portions of the conductive material 306 may form the conductive structures 322, as shown in FIG. 3F. The conductive structures 322 may, optionally, include a cap 324 formed from the oxide-nitride-oxide material 308.

By controlling the pitch P2 of the conductive structures 322, formation of more space efficient capacitors 332 is provided, and the variability of the width W2 between the conductive structures 322 permits optimization of voltage threshold and increased capacitance in comparison to conventional planar capacitors.

Referring still to FIG. 3F, the semiconductor structure 300 is shown after selective removal of the conductive material 306 and removal of the spacers 318, producing the conductive structures 322. As previously discussed, each of the conductive structures 322 may have a width W3 of less than about 65 nm and, more specifically, of about 35 nm. The gaps 326 may laterally space the conductive structures 322 apart from one another by a width W2 of between about 15 nm and about 100 nm and, more particularly, of about 25 nm. The width of the gaps 326 (i.e., spacing between the conductive structures 322) may be controlled based on a dielectric constant of a dielectric material (not shown) that will be deposited therein to alter the capacitance and threshold voltage of the semiconductor structure 300. Using the method shown in FIGS. 3A-3F, the dielectric thickness may be varied to support a desired voltage within a minimum space. Since a substantially greater area of the capacitor 332 may be provided in the same amount of space as a conventional planar capacitor, the semiconductor structure 300 uses less space than the conventional planar capacitor. The dielectric material (not shown) may subsequently be deposited in the gaps 326, forming the capacitor 332.

Figure 3G:
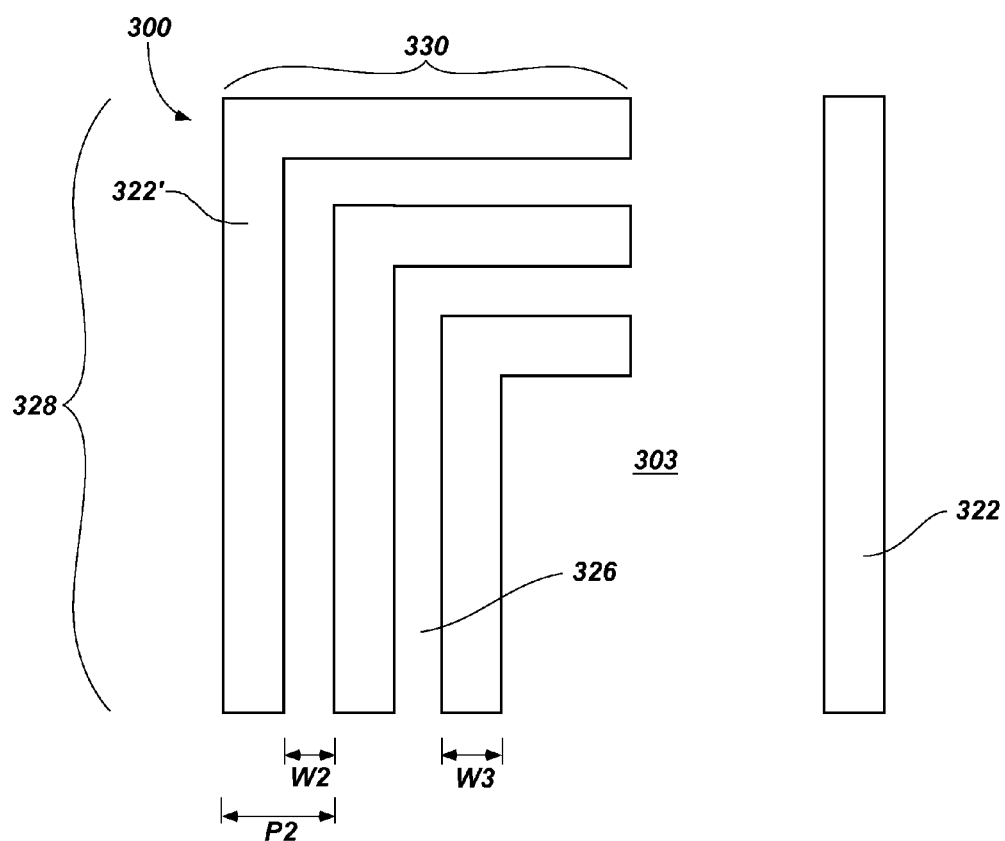
FIG. 3G is a plan view of the semiconductor structure shown in FIG. 3F.

FIG. 3G is a top-down plan view of the semiconductor structure 300 shown in FIG. 3F after deposition of a dielectric material 303 thereover. The conductive structures 322 may be vertically aligned with one another and may each include, for example, elongate portions 328 separated by the dielectric material 303, which fills gaps 326. The semiconductor structure 300 may include a plurality of conductive structures 322, each of which includes an elongate portion 328 and at least one portion 330 extending perpendicular to the elongate portion 328. Each of the conductive structures 322 may include a single portion 330 extending perpendicular to the elongate portion 328. Additionally, each of the conductive structures 322 may include multiple portions (not shown) extending perpendicular the elongate portion 328 to form a comb-like structure. As previously discussed, capacitor 332 formed using the methods described herein may also be used for forming devices other than non-volatile memories, such as for example volatile memories.

While the invention is susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A memory device comprising:
a memory array comprising a plurality of memory cells; and
a peripheral circuit associated with the memory array and including a capacitor, the capacitor comprising a plurality of conductive structures, each conductive structure of the plurality of conductive structures laterally spaced apart from a respective adjacent conductive structure of the plurality of conductive structures by a dielectric material, wherein each conductive structure of the plurality of conductive structures comprises an elongated portion and at least one portion extending perpendicular to the elongated portion, and wherein each of the elongated portion and the at least one portion extending perpendicular to the elongated portion is planar and vertically oriented with respect to a substrate of the memory device.

2. The memory device of claim 1, wherein the memory device is a fully formed NAND memory device.

3. The memory device of claim 1, wherein a voltage applied by the peripheral circuit comprises about 20 volts.

4. The memory device of claim 1, wherein the thickness of the dielectric material is based on the dielectric constant of the dielectric material and a predetermined voltage.

5. The memory device of claim 1, wherein the peripheral circuit comprises a charge pump.

6. The memory device of claim 1, wherein the peripheral circuit comprises a decoupling capacitor.

7. The memory device of claim 1, wherein the peripheral circuit comprises an ESD circuit.

8. The memory device of claim 1, wherein the conductive structures comprise laterally-spaced lines configured in a comb-like pattern.

9. The memory device of claim 1, wherein the peripheral circuit is configured to generate a voltage between about 5 volts and 30 volts.

10. A memory device comprising:
a NAND memory array comprising a plurality of memory cells; and
a charge pump circuit associated with the NAND memory array and including a capacitor, the capacitor comprising a plurality of conductive structures, each conductive structure of the plurality of conductive structures laterally spaced apart from a respective adjacent conductive structure of the plurality of conductive structures by a dielectric material, wherein each conductive structure of the plurality of conductive structures comprises an L-shaped cross section in a plane parallel to a substrate of the memory device, wherein a height of each conductive structure of the plurality of conductive structures is greater than a thickness of the L-shaped cross-section of each conductive structure of the plurality of conductive structures in the plane parallel to the substrate of the memory device.

11. The memory device of claim 10, wherein the charge pump circuit is configured to generate a voltage of between about 5 volts and about 30 volts.

12. The memory device of claim 10, wherein the dielectric material has a thickness and a dielectric constant such that the dielectric material can withstand a voltage of about 20 volts or more.

13. The memory device of claim 10, wherein each conductive structure of the plurality of conductive structures has a ratio of height to width of from about 2:1 to about 8:1.

14. The memory device of claim 10, wherein each conductive structure of the plurality of conductive structures comprises an oxide-nitride-oxide material.

15. A memory device comprising:
a memory array comprising a plurality of memory cells; and
a peripheral circuit associated with the memory array and including a capacitor, the capacitor comprising a plurality of conductive structures, each conductive structure of the plurality of conductive structures comprising an elongate portion and a portion extending perpendicular to the respective elongated portion, wherein each of the elongated portion and the at least one portion extending perpendicular to the elongated portion is planar and vertically oriented with respect to a substrate of the memory device.

16. The memory device of claim 15, wherein each elongate portion of each conductive structure of the plurality of conductive structures is spaced laterally apart from a respective adjacent elongate portion by a dielectric material.

17. The memory device of claim 15, wherein each portion extending perpendicular to the respective elongate portion of each conductive structure of the plurality of conductive structures is spaced laterally apart from a respective adjacent portion extending perpendicular to a respective elongate portion by a dielectric material.

18. The memory device of claim 15, wherein the portions extending perpendicular to the respective elongate portions of each conductive structure of the plurality of conductive structures are configured in a comb-like pattern.

* * * * *